(12) United States Patent
Bin et al.

(10) Patent No.: US 9,209,291 B2
(45) Date of Patent: Dec. 8, 2015

(54) THREE-DIMENSIONAL SEMICONDUCTOR DEVICE

(75) Inventors: Jin Ho Bin, Seoul (KR); Ki Hong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 537 days.

(21) Appl. No.: 13/601,355

(22) Filed: Aug. 31, 2012

(65) Prior Publication Data

US 2013/0161731 A1 Jun. 27, 2013

(30) Foreign Application Priority Data

Dec. 22, 2011 (KR) .................. 10-2011-0139981

(51) Int. Cl.
| | |
|---|---|
| *H01L 27/115* | (2006.01) |
| *H01L 29/78* | (2006.01) |
| *H01L 29/66* | (2006.01) |
| *H01L 29/792* | (2006.01) |

(52) U.S. Cl.
CPC ............ *H01L 29/78* (2013.01); *H01L 27/1158* (2013.01); *H01L 27/11582* (2013.01); *H01L 29/66833* (2013.01); *H01L 29/7926* (2013.01)

(58) Field of Classification Search
CPC ................... H01L 27/11551; H01L 27/11578; H01L 27/11582; H01L 29/66833; H01L 29/7926
See application file for complete search history.

(56) References Cited

U.S. PATENT DOCUMENTS

| | | | | |
|---|---|---|---|---|
| 2011/0298013 A1* | 12/2011 | Hwang et al. | ................. | 257/208 |
| 2011/0303969 A1* | 12/2011 | Kai et al. | ...................... | 257/324 |
| 2012/0168858 A1* | 7/2012 | Hong | ............................ | 257/330 |
| 2012/0241844 A1* | 9/2012 | Iguchi et al. | .................. | 257/324 |
| 2012/0329224 A1* | 12/2012 | Kong et al. | ................... | 438/268 |
| 2013/0009236 A1* | 1/2013 | Lee et al. | ..................... | 257/329 |
| 2013/0069152 A1* | 3/2013 | Lee et al. | ..................... | 257/335 |
| 2013/0164922 A1* | 6/2013 | Cho et al. | ..................... | 438/510 |

FOREIGN PATENT DOCUMENTS

WO  WO 2012/009076 A2 * 1/2012

\* cited by examiner

*Primary Examiner* — Bac Au
*Assistant Examiner* — Toniae Thomas
(74) *Attorney, Agent, or Firm* — IP & T Group LLP

(57) ABSTRACT

A three-dimensional (3D) semiconductor device includes first interlayer dielectric layers and word lines that are alternately stacked on a substrate; select lines formed on the first interlayer dielectric layers and the word lines; etch stop patterns formed on the select lines to contact the select lines; channel holes formed to pass through the select lines, the first interlayer dielectric layers, and the word lines; channel layers formed on surfaces of the channel holes; insulating layers formed in the channel holes, the insulating layers having an upper surface that is lower than upper surfaces of the etch stop patterns; impurity-doped layers formed in channel holes on upper surface of the insulating layers; and a second interlayer dielectric layer formed over the etch stop patterns and the impurity-doped layers.

11 Claims, 14 Drawing Sheets

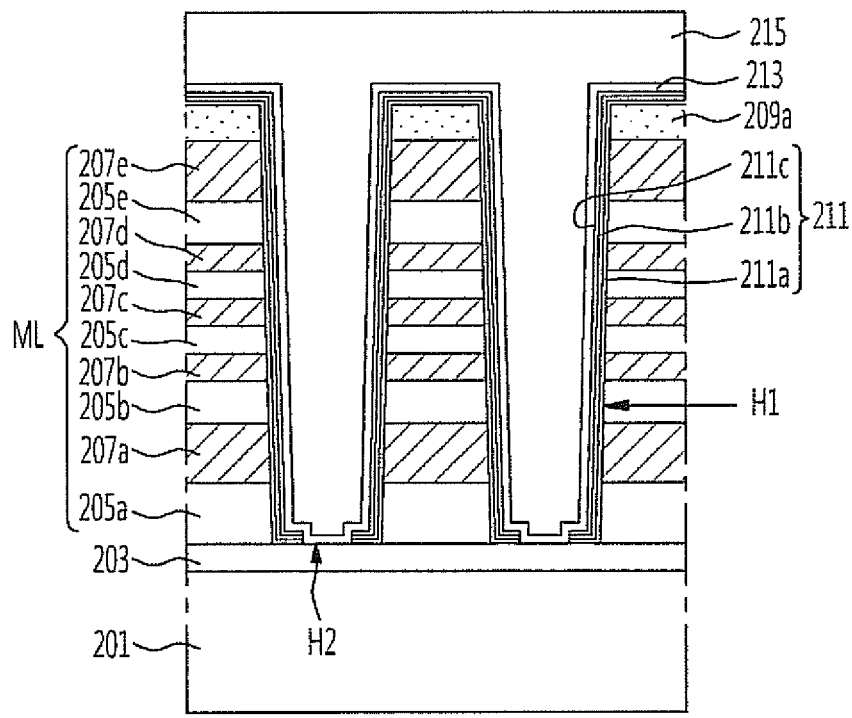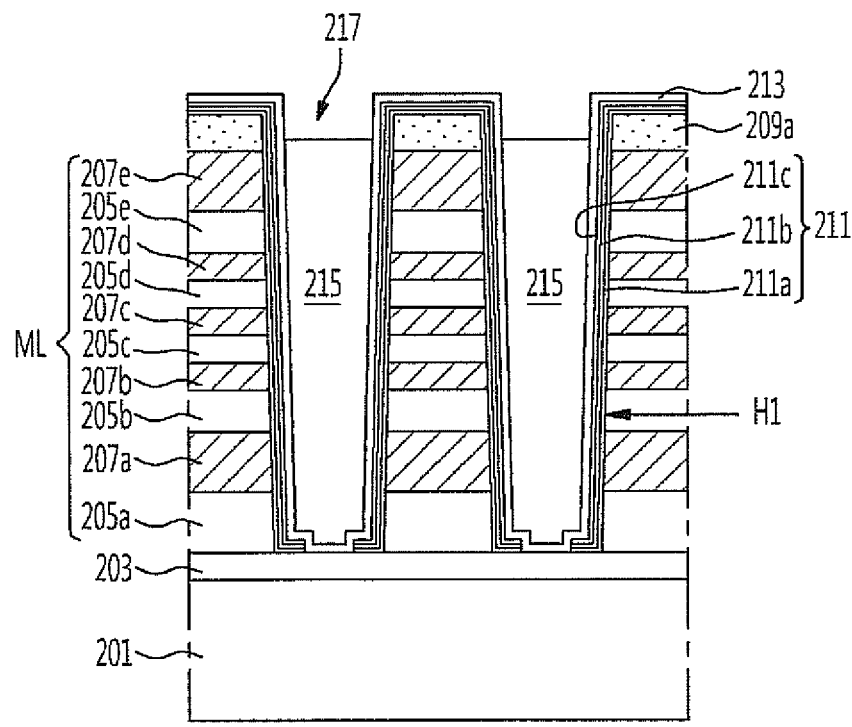

THREE-DIMENSIONAL SEMICONDUCTOR DEVICE

CROSS-REFERENCE TO RELATED APPLICATION

This application claims priority to and the benefit of Korean Patent Application No. 10-2011-0139981, filed on Dec. 22, 2011, the disclosure of which is incorporated herein by reference in its entirety.

BACKGROUND

The present invention relates to a semiconductor device and a method of manufacturing the same. More specifically, the present invention relates to a three-dimensional (3D) semiconductor device and a method of manufacturing the same.

Discussion of Related Art

As there is a growing need to increase the integration degrees of semiconductor devices, various techniques have been developed to increase the integration degrees of semiconductor devices. As a representative method, the integration degree of memory cells is increased within a limited space by reducing the sizes of the memory cells that are two-dimensionally disposed on a semiconductor substrate. However, there are physical limitations to reducing the size of the memory cells. To overcome such physical limitations, a three-dimensional (3D) semiconductor device including memory cells that are three-dimensionally disposed has been suggested.

In the case of a 3D semiconductor device, the area of a semiconductor substrate may be efficiently used and the degree of integration of memory cells may be higher than when memory cells are two-dimensionally disposed. In particular, research has been actively conducted on applying a regular arrangement of memory cells in a NAND flash device, which is useful to increase an integration degree of a semiconductor memory device, to 3D semiconductor devices. However, 3D semiconductor devices are less reliable than two-dimensional (2D) semiconductor devices. Accordingly, various techniques need to be developed to improve the reliability of 3D semiconductor devices.

SUMMARY OF THE INVENTION

The present invention is directed to a three-dimensional (3D) semiconductor device having improved reliability and a method of manufacturing the same.

One aspect of the present invention provides a method of manufacturing a semiconductor device, the method including a method of manufacturing a semiconductor device, the method comprising forming a multilayered structure by alternately stacking first material layers and second material layers on a substrate, where an uppermost layer of the multilayered structure is one of the second material layers; forming etch stop patterns on the multilayered structure; forming channel holes by etching the multilayered structure using the etch stop patterns as an etch barrier; forming channel layers on surfaces of the channel holes; filling the channel holes and a space between the etch stop patterns with insulating layers; forming recessed regions between the etch stop patterns by recessing the insulating layers; forming impurity-doped layers inside the recessed regions; and forming an interlayer dielectric layer over the impurity-doped layers and the etch stop patterns.

Another aspect of the present invention provides a semiconductor device comprising first interlayer dielectric layers and word lines that are alternately stacked on a substrate; select lines formed on the first interlayer dielectric layers and the word lines; etch stop patterns formed on the select lines to contact the select lines; a pair of channel holes formed to pass through the select lines, the first interlayer dielectric layers, and the word lines; a channel layer formed on a surface of the pair of channel holes; an insulating layer formed in the pair of channel holes, the insulating layer having an upper surface that is lower than upper surfaces of the etch stop patterns; impurity-doped layers formed in the pair of channel holes on the upper surface of the insulating layer; and second interlayer dielectric layers formed over the etch stop patterns and the impurity-doped layers.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 3A to 3H are cross-sectional views illustrating a method of manufacturing a semiconductor device according to another exemplary embodiment of the present invention, taken along a line I-I' of FIG. 2;

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete and will fully convey the concept of the invention to those of ordinary skill in the art. The scope of the invention is defined in the claims and their equivalents.

FIGS. 1A to 1F are cross-sectional views illustrating a method of manufacturing a semiconductor device according to an exemplary embodiment of the present invention. In particular, FIGS. 1A to 1F are cross-sectional views illustrating a method of forming a select transistor area of a semiconductor device according to an exemplary embodiment of the present invention.

Figure 1A:
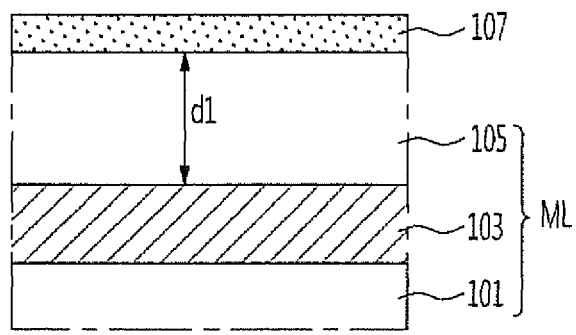
FIGS. 1A to 1F are cross-sectional views illustrating a method of manufacturing a semiconductor device according to an exemplary embodiment of the present invention.

Referring to FIG. 1A, a multilayered structure ML in which interlayer dielectric layers and gate conductive layers are alternately stacked is formed. In the multilayered structure ML, the interlayer dielectric layers are oxide layers, and the gate conductive layers are formed of a conductive material, e.g., a polysilicon layer or a metal layer.

A conductive layer 103 forms a select line. An interlayer dielectric layer 101, formed under the conductive layer 103, insulates the conductive layer 103 from a conductive layer (not shown) that forms a word line under the conductive layer 103. An interlayer dielectric layer 105, formed on the conductive layer 103, insulates the conductive layer 103 from a conductive line (not shown) to be formed on the multilayered structure ML in a subsequent process. The interlayer dielectric layer 105, formed on the conductive layer 103, may be formed to a thickness that is equal to or greater than a predetermined thickness d1, so as to prevent interference between the conductive line and the conductive layer 103.

A hard-mask layer 107 is formed on the multilayered structure ML, which includes the interlayer dielectric layers 101 and 105 and the conductive layer 103. The hard-mask layer 107 is formed of a material, e.g., a nitride layer, which may act as an etch barrier when the multilayered structure is etched. The hard-mask layer 107 may be formed to a thickness that is equal to or greater than a predetermined thickness so that it may act as an etch barrier.

Figure 1B:
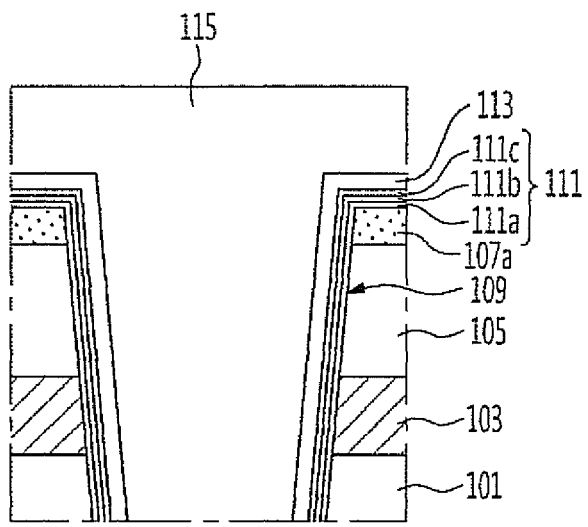

Referring to FIG. 1B, the hard-mask layer 107 is patterned by photolithography to form hard-mask patterns 107a that expose some regions of the multilayered structure. The multilayered structure exposed via the hard-mask patterns 107a is etched to form a channel hole 109 that passes through the multilayered structure including the interlayer dielectric layers 101 and 105 and the conductive layer 103. Although only one channel hole 109 is illustrated in FIGS. 1B to 1F, a plurality of channel holes 109 may be formed.

A multilayer film 111 is formed on a surface of the entire structure in which the channel hole 109 is formed. The multilayer film 111 has a stacked structure including an insulating layer 111a, a charge storage layer 111b, and an insulating layer 111c. For example, the charge storage layer 111b may be formed of a nitride layer that allows charge trapping, and the insulating layers 111a and 111c may be each formed of an oxide layer.

A channel layer 113 is formed on a surface of the multilayer film 111. The channel layer 113 is a polysilicon layer. After the channel layer 113 is formed, the inside of the channel hole 109 is filled with a gap-filling insulating layer 115.

Figure 1C:
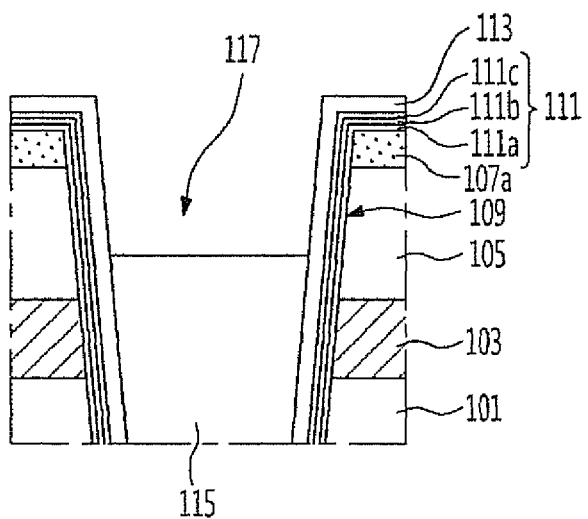

Referring to FIG. 1C, the gap-filling insulating layer 115 is planarized in a planarization process until the polysilicon channel layer 113 is exposed. Then, the gap-filling insulating layer 115 may be recessed in a wet etching process. Thus, an upper surface of the gap-filling insulating layer 115 is lower than that of the interlayer dielectric layer 105, which is the uppermost layer of the multilayered structure. A recessed region 117 is formed in a region of the channel hole 109 from which the gap-filling insulating layer 115 is removed.

The recessed region 117, which is to be subsequently filled with an impurity-doped layer 119 and made into a junction region, is set to have a depth determined in consideration of the distance between the conductive layer 103 for a select line and the junction region. The depth of the recessed region 117 may be determined according to a degree of etching the gap-filling insulating layer 115 during the wet etch process.

Figure 1D:
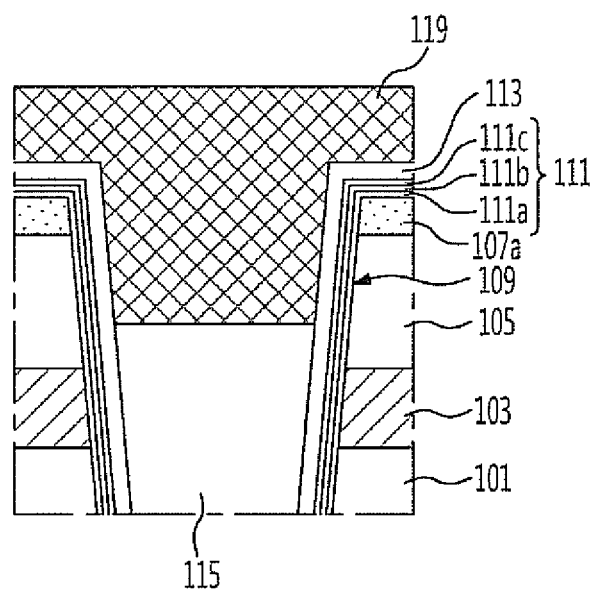

Referring to FIG. 1D, the recessed region 117 is filled with the impurity-doped layer 119 that will become the junction region. For example, the impurity-doped layer 119 may be a polysilicon layer doped with N type impurities. The impurity-doped layer 119 contacts the channel layer 113. A bottom surface of the impurity-doped layer may be formed to be higher than a bottom surface of the conductive layer 103.

Figure 1E:
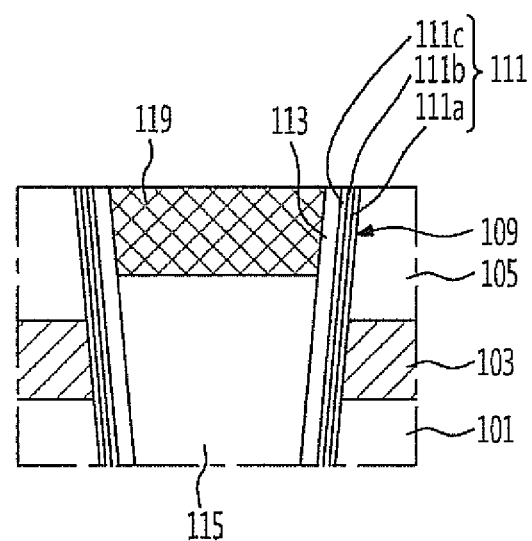

Referring to FIG. 1E, the impurity-doped layer 119, the channel layer 113, and the multilayer film 111 are planarized by a planarization process until the hard-mask pattern 107a, which is a nitride layer, is exposed. Thus, the impurity-doped layer 119, the channel layer 113, and the multilayer film 111 are removed from an upper surface of the multilayered structure, but remain in the channel hole 109. Afterwards, the hard-mask patterns 107a are removed.

Figure 1F:
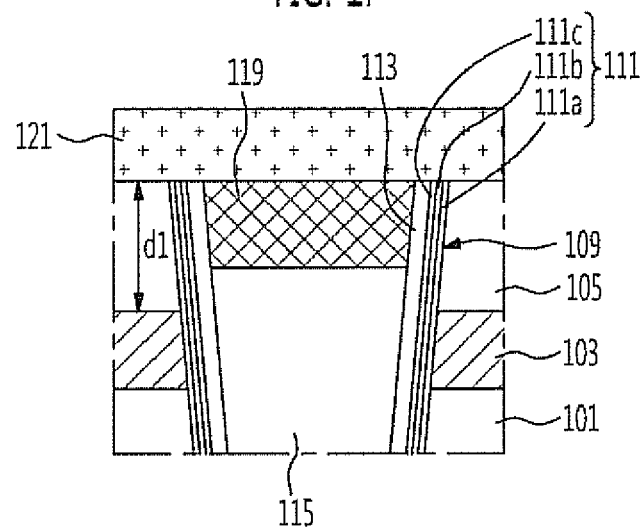

Referring to FIG. 1F, a conductive line 121 is formed on the impurity-doped layer 119, which is the junction region, to contact the impurity-doped layer 119.

Figure 2:
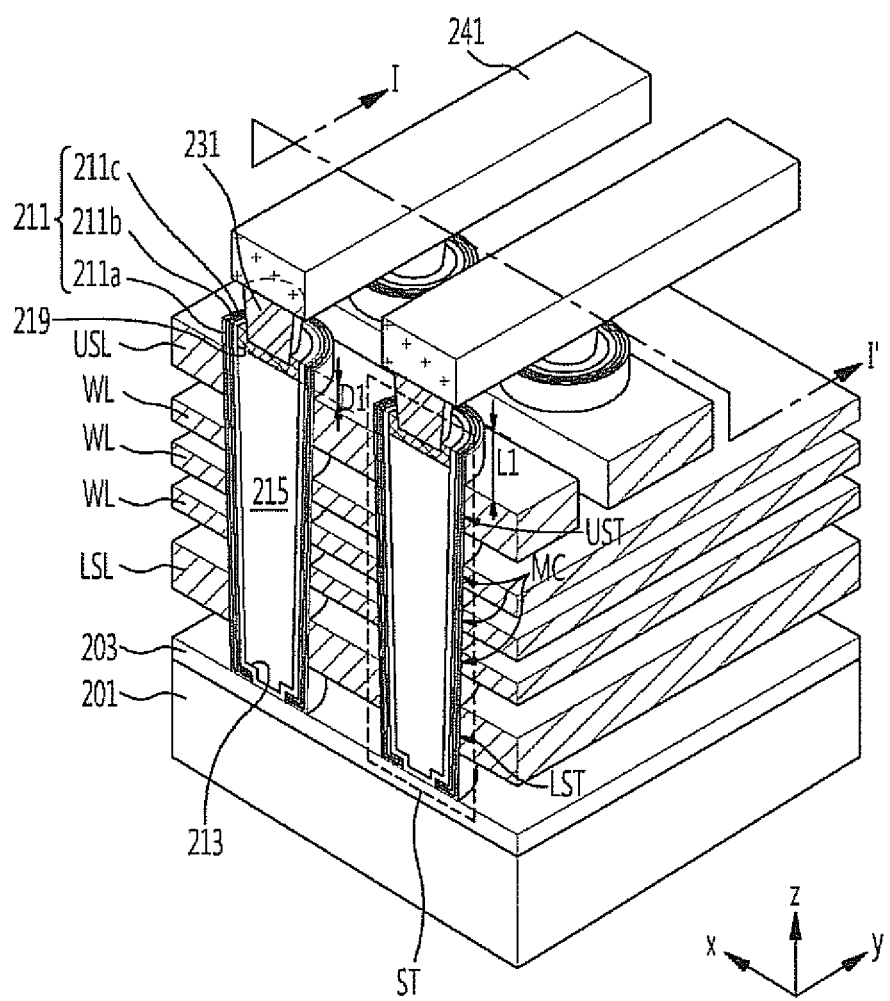
FIG. 2 is a perspective view of a semiconductor device according to another exemplary embodiment of the present invention.

FIG. 2 is a perspective view of a semiconductor device according to another exemplary embodiment of the present invention. In particular, FIG. 2 illustrates a three-dimensional (3D) flash device including vertical memory strings. In FIG. 2, an interlayer dielectric layer and an etch stop pattern are not illustrated.

Referring to FIG. 2, the semiconductor device includes a common source area 203, a plurality of bit lines 241, and a plurality of memory strings ST between the common source area 203 and the bit lines 241.

The common source area 203 is an impurity-implanted area obtained by either forming a doped polysilicon layer on a semiconductor substrate 201 or implanting the semiconductor substrate 201 with impurities. The plurality of memory strings ST forming a memory block may contact an upper surface of the common source area 203.

The bit lines 241 are conductive patterns disposed on, but separate from, the semiconductor substrate 201. The plurality of bit lines 241 is disposed in parallel, but separate from, one another. For example, the bit lines 241 extend in a y-direction of a xyz coordinate system. The memory strings ST are connected in parallel to lower portions of the bit lines 241, respectively.

Each of the memory strings ST includes an upper select transistor UST, a lower select transistor LST, and a plurality of memory cells MC that are connected in series in the z-direction. The lower select transistor LST is connected to the common source area 203. The upper select transistor UST is connected to one of the bit lines 241. The memory cells MC are disposed between the lower select transistor LST and the upper select transistor UST.

A gate of the lower select transistor LST is disposed separate from the semiconductor substrate 201, and is connected to a first select line LSL disposed on the semiconductor substrate 201. A gate of the upper select transistor UST is disposed separate from the bit lines 241, extends in a direction that intersects the plurality of bit lines 241, and is connected to a second select line USL disposed under the plurality of bit lines 241. Gates of the memory cells MC are connected to word lines WL that are disposed between the first and second select lines LSL and USL and separate from the first and second select lines LSL and USL. The word lines WL are separately stacked in a multilayer structure. The word lines WL and the first select lines LSL may be divided in units of memory blocks or a plurality of line patterns extending in one direction.

Each of the memory strings ST includes a channel layer 213 that is connected to the common source area 203 and that extends in the z-direction perpendicular to the semiconductor substrate 201. The channel layer 213 passes through the first and second select lines LSL and USL and the word lines WL to be connected to the common source area 203.

The channel layer 213 is covered with a multilayer film 211. The multilayer film 211 may include a first insulating layer 211a, a charge storage layer 211b, and a second insulating layer 211c. The charge storage layer 211b may not be included in the multilayer film 211 between the first and second select lines LSL and USL and the channel layer 213. The channel layer 213 is used as a channel of the lower and upper select transistors LST and UST and the memory cells MC.

The channel layer 213 may have a cup or tube shape. An inside of the channel layer 213 is filled with a gap-filling insulating layer 215 and an impurity-doped layer 219 that will become a junction region.

The impurity-doped layer 219 is formed on the gap-filling insulating layer 215 to contact the channel layer 213. The impurity-doped layer 219 may also be used as a drain junction region of each of the memory strings ST. Bit line contact plug 231 is further formed between the bit line 241 and the impurity-doped layer 219 so as to connect the bit line 241 and the memory string ST. A distance L1 between the impurity-doped layer 219 and the bit line 241 is greater than a depth D1 of the impurity-doped layer 219. Bottom surfaces of the impurity-doped layers 219 may be formed to be higher than bottom surfaces of the first and second select lines USL and LSL.

FIGS. 3A to 3H are cross-sectional views, taken along a line I-I' of FIG. 2, illustrating a method of manufacturing a semiconductor device according to an exemplary embodiment of the present invention.

Figure 3A:
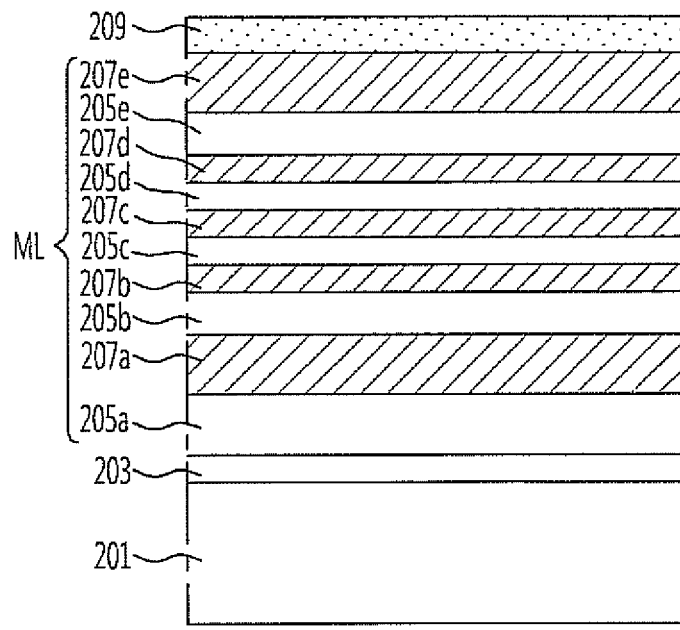

Referring to FIG. 3A, a multilayered structure ML in which a plurality of first material layers 205a to 205e and a plurality of second material layers 207a to 207e are alternately stacked is formed on a semiconductor substrate 201 including a common source area 203.

The semiconductor substrate 201 may further include an impurity-implanted well structure. The common source area 203 may be formed by implanting impurities into the semiconductor substrate 201 or depositing a doped polysilicon layer on the semiconductor substrate 201. N type impurities may be implanted into the common source area 203.

The first material layers 205a to 205e of the multilayered structure ML are formed in regions in which interlayer dielectric layers are to be formed, and may be interlayer dielectric layers or sacrificial layers. The lowermost second material layer 207a, among the second material layers 207a to 207e, is formed in a region in which a first select line is to be formed. The uppermost second material layer 207e among the second material layers 207a to 207e is formed in a region in which a second select line is to be formed. The other second material layers 207b to 207d are formed in a region in which word lines are to be formed. A number of these first and second material layers may vary according to a desired number of stacked memory cells. The second material layers 207a and 207e that define the regions in which the first and second select lines are to be respectively formed may be thicker than the second material layers 207b to 207d that define the regions in which the word lines are to be formed. The second material layers 207a to 207e may be conductive or sacrificial layers. When the second material layers 207a to 207e are conductive layers, the first material layers 205a to 205e may be sacrificial layers or interlayer dielectric layers. When the second material layers 207a to 207e are sacrificial layers, the first material layers 205a to 205e may be interlayer dielectric layers. The second material layers 207a to 207e that are conductive layers may be formed of a polysilicon layer or a metal layer. In particular, when the second material layers 207a to 207e that are conductive layers are formed of a doped polysilicon layer, the first material layers 205a to 205e that are sacrificial layers may be formed of an undoped polysilicon layer. The second material layers 207a to 207e that are sacrificial layers may be formed of an insulating material having an etch selectivity from different an etching selectivity of an insulating layer 209, which is used as a hard-mask layer. The second material layers 207a to 207e that are interlayer dielectric layers may be formed of a silicon oxide layer.

In the multilayered structure ML, according to the current embodiment, the uppermost layer is the second material layer 207e that defines the region in which the second select line is to be formed.

The thicknesses of the first material layers 205a to 205e of the multilayered structure ML are described below. The first material layers 205a, 205b, and 205e respectively define a distance between the first select line and an adjacent word line, a distance between the first select line and the common source area 203, and a distance between the second select line and an adjacent word line. The first material layers 205a, 205b, and 205e are formed to be thicker than the first material layers 205c and 205d that define the distances between the word lines. In the multilayered structure ML, the first material layers 205a to 205e and the second material layers 207a to 207e may be stacked in a memory cell area, in the form of a flat panel. In the multilayered structure ML, the first material layers 205a to 205e and the second material layers 207a to 207e are patterned so that widths of the first material layers 205a to 205e and widths of the second material layers 207a to 207e gradually change from bottom to top. This gives edges of the multilayered structure ML a stepped shape. To achieve this stepped shape, the multilayered structure ML may be repeatedly etched using a photoresist pattern as a mask, while reducing the size of the photoresist pattern. The photoresist pattern may then be removed. Furthermore, a process of patterning the second material layer 207e, which defines a region in which the second select line is to be formed, may further be performed.

The insulating layer 209, which is used as a hard-mask layer, is formed on the multilayered structure ML. The uppermost layer of the multilayered structure ML is the second material layer 207e that defines the region in which the second select line is to be formed. Accordingly, the insulating layer 209 and the second material layer 207e are formed to contact each other.

The insulating layer 209 acts as an etch barrier during a subsequent process of forming a channel hole by etching the multilayered structure ML to expose the common source area 203. The insulating layer 209 is formed of a material having an etch selectivity different from the etch selectivity of the first material layers 205a to 205e and the second material layers 207a to 207e. For example, the insulating layer 209 may be formed of a silicon nitride layer. The insulating layer 209 is formed to a thickness sufficient not to be removed during an etch process of forming the channel hole. The thickness may vary according to a height of the multilayered structure ML.

Figure 3B:
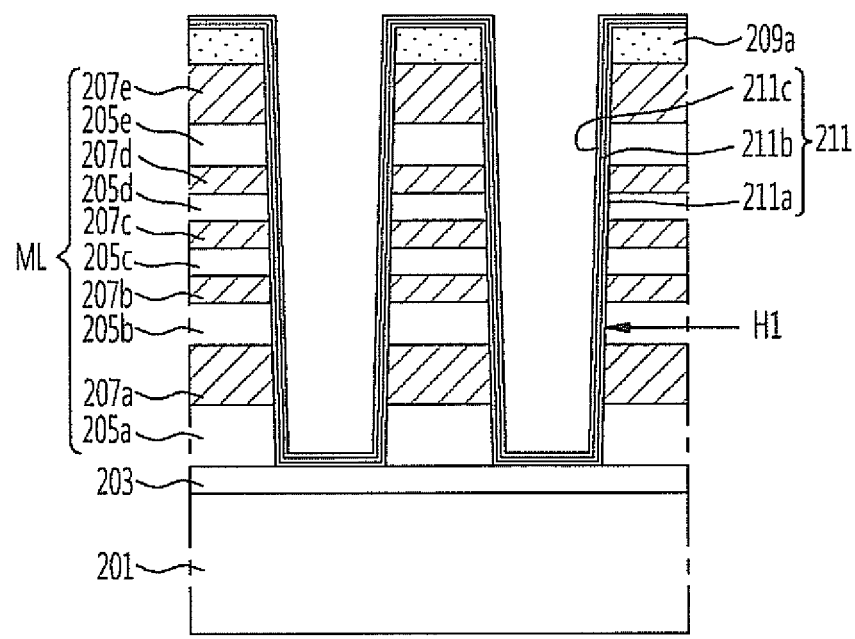

Referring to FIG. 3B, the insulating layer 209 is patterned to form etch stop patterns 209a for exposing regions in which a plurality of channel holes H1 are to be formed. Then, some regions of the multilayered structure ML, exposed via the etch stop patterns 209a, are removed to form the channel holes H1 that pass through the multilayered structure ML.

The first material layers 205a to 205e and the second material layers 207a to 207e, exposed through the etch stop patterns 209a, may be etched by anisotropic etching to form the channel holes H1. The channel holes H1 may be arranged in a matrix on a xy plane.

Then, a multilayer film 211 is formed on a surface of the entire resultant structure including the channel holes H1. The multilayer film 211 may be formed by stacking a first insulating layer 211a, a charge storage layer 211b, and a second insulating layer 211c. The charge storage layer 211b may be formed of a nitride layer that allows charge trapping, and the first and second insulating layers 211a and 211c may be formed of an oxide layer.

Referring to FIG. 3C, a plurality of contact holes H2 for exposing the common source area 203 are formed by selectively removing the multilayer film 211 from bottom surfaces of the channel holes H1. To this end, an etch-back process may be performed. Otherwise, a mask pattern may be formed to open only regions in which the contact holes H2 are to be formed, the multilayer film 211, exposed via the mask pattern, is etched using the mask pattern as an etch barrier, and then the mask pattern may be removed.

Afterwards, a channel layer 213 is formed on the entire resultant structure including the channel holes H2. The channel layer 213 is a semiconductor layer and may be formed of a silicon layer. The channel layer 213 is connected to the common source area 203 exposed via the channel holes H2.

Then, a gap-filling insulating layer 215 is formed on the entire resultant structure, including the channel layer 213, to a thickness sufficient so that the insides of the channel holes H1 and spaces between the etch stop patterns 209a may be filled with the gap-filling insulating layer 215. The gap-filling insulating layer 215 may be formed of a material having a high fluidity so that the insides of the channel holes H1, which are narrow and long, may be filled with the gap-filling insulating layer 215 without any voids. For example, the gap-filling insulating layer 215 may be formed of a spin-on dielectric (SOD) layer. The SOD layer may formed of polysilazane (PSZ).

Referring to FIG. 3D, the gap-filling insulating layer 215 is planarized in a planarization process until the channel layer 213 is exposed, and is then recessed in a wet etch process. Thus, an upper surface of the gap-filling insulating layer 215 is lower than that of the etch stop patterns 209a, and regions between the etch stop patterns 209a, from which the gap-filling insulating layer 215 is removed, are defined as recessed regions 217. Surfaces of the gap-filling insulating layer 215, which define bottoms of the recessed regions 217, are controlled not to be lower than a bottom surface of the second material layer 207e, which defines the region in which the second select line is to be formed. The planarization process may be performed by chemical mechanical polishing (CMP).

The recessed regions 217 are to be filled with an impurity-doped layer during a subsequent process. According to the previous embodiment, the recessed regions 117, described above with reference to FIG. 1C, are formed by etching not only the gap-filling insulating layer 115, filled between the hard mask patterns 107a, which are etch stop patterns, but also a part of the gap-filling insulating layer 115 that fills a region passing through the interlayer dielectric layer 105. In the previous embodiment, this controls the distance between an impurity-doped layer and a conductive layer, for a select gate, to appropriately drive the semiconductor device. In contrast, in the current embodiment, the recessed regions 217 are formed by partially etching the gap-filling insulating layer 215 between the etch stop patterns 209a. Thus, a degree of etching of the gap-filling insulating layer 215 that is required to form the recessed regions 217 may be less than in the previous embodiment. In the current embodiment, a degree of recessing the gap-filling insulating layer 215 in the channel holes H1 may be more uniformly controlled than in the previous embodiment. Thus, the depths of the recessed regions 217 may be made more uniform than would be achieved in the previous embodiment. When the depths of the recessed regions 217 are more uniform, the depths of impurity-doped layers 219, which are to be formed in the recessed regions 217 during a subsequent process, may be more uniform. Thus, the operating characteristics of the memory strings ST may be made more uniform.

Figure 3E:
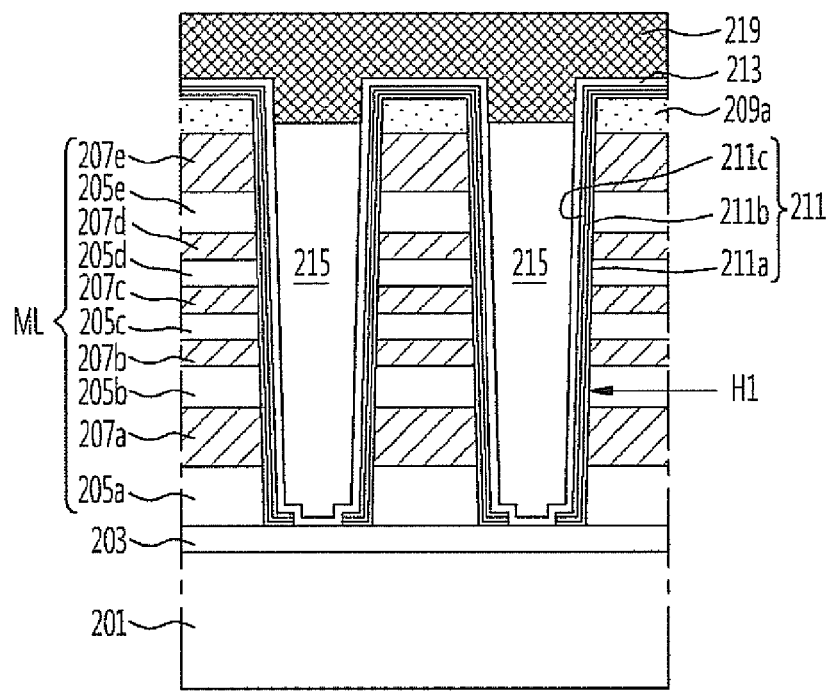

Referring to FIG. 3E, the recessed regions 217 are filled with the impurity-doped layers 219 that will become junction regions. For example, the impurity-doped layers 219 may be polysilicon layers into which N type impurities are implanted. The impurity-doped layers 219 are connected to the channel layer 213.

Figure 3F:
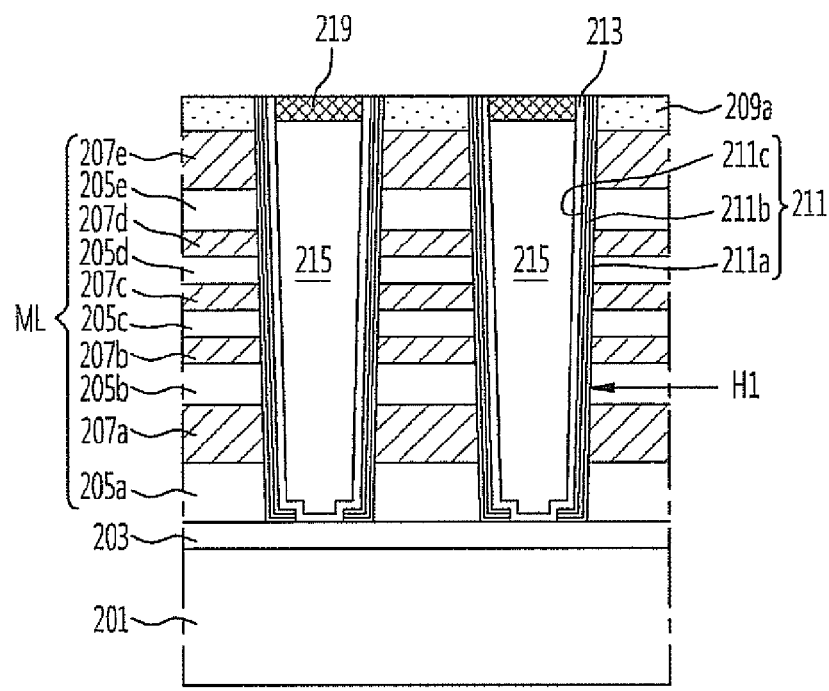

Referring to FIG. 3F, the impurity-doped layers 219, the channel layer 213, and the multilayer film 211 are planarized in the planarization process until the etch stop patterns 209a, which are nitride layers, are exposed. Thus, the impurity-doped layers 219, the channel layer 213, and the multilayer film 211 are removed from an upper surface of the multilayered structure ML, but remain in the channel holes H1 and on sidewalk of the recessed regions 217. The planarization process may be performed by CMP.

Figure 3G:
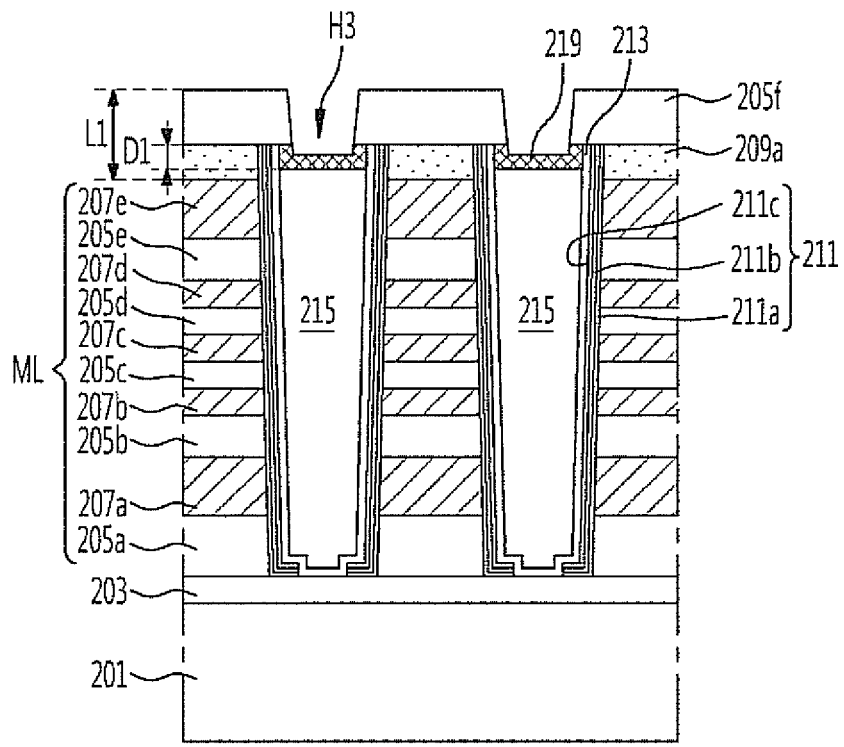

Referring to FIG. 3G, interlayer dielectric layers 205f are formed on the entire resultant structure, including the etch stop patterns 209a and the planarized impurity-doped layer 219. The interlayer dielectric layers 205f may be formed of the insulating material used to form the first material layers 205a to 205e, which are also interlayer dielectric layers.

A thickness of each of the interlayer dielectric layers 205f defines a distance L1 between bit lines and the second select line to be formed during a subsequent process. Thus, the thickness of each of the interlayer dielectric layers 205f should be thick enough to prevent interference between an upper select transistor and the bit lines. In the current embodiment, the recessed regions 217 are formed by etching the gap-filling insulating layer 215, which are then filled with the impurity-doped layer 219. The interlayer dielectric layer 205f is formed on the second select line after the recessed regions 217 are filled with the impurity-doped layer 219. Thus, in the current embodiment, even if the thickness of each of the interlayer dielectric layer 205f changes, the degree of recessing the gap-filling insulating layer 215, to form recessed regions 217, does not change. Accordingly, the desired thickness of each of the interlayer dielectric layers 205f may be based on preventing interference between the upper select transistor and the bit lines, without considering a degree of recessing of the gap-filling insulating layer 215.

The thickness of each of the interlayer dielectric layers 205f is to be greater than those of the first material layers 205c and 205d, which define the distances between the word lines, and greater than the thickness D1 of the impurity-doped layer 219, in order to prevent interference.

After the interlayer dielectric layer 205f is formed, a process of forming contact holes H3 in the interlayer dielectric layer 205f for a select gate is performed. This process includes forming a mask pattern (not shown) for opening regions in which the contact holes H3 are to be formed, exposing the impurity-doped layer 219 by removing some regions of the interlayer dielectric layer 205f that are open via the mask pattern, and removing the mask pattern. Here, the mask pattern is formed of a material having an etch selectivity different from an etch selectivity of the interlayer dielectric layer 205f and the impurity-doped layers 219. For example, the mask pattern may be formed of a silicon nitride layer used to form the etch stop patterns 209a.

In the current embodiment, when a material different from that of the interlayer dielectric layer 205f remains, the contact holes H3 are formed. More particularly, when the etch stop patterns 209a, which are formed of a material having an etch selectivity different from the etch selectivity of the interlayer dielectric layers 205f remain, the contact holes H3 are formed. Thus, even if a miss-alignment occurs during the forming of the contact holes H3, an etch process for forming the contact holes H3 may be stopped by the etch stop patterns 209a. Thus, in the current embodiment, insulating characteristics between the impurity-doped layers 219 can be ensured by preventing an insulating material between the impurity-doped layers 219 from being removed.

Figure 3H:
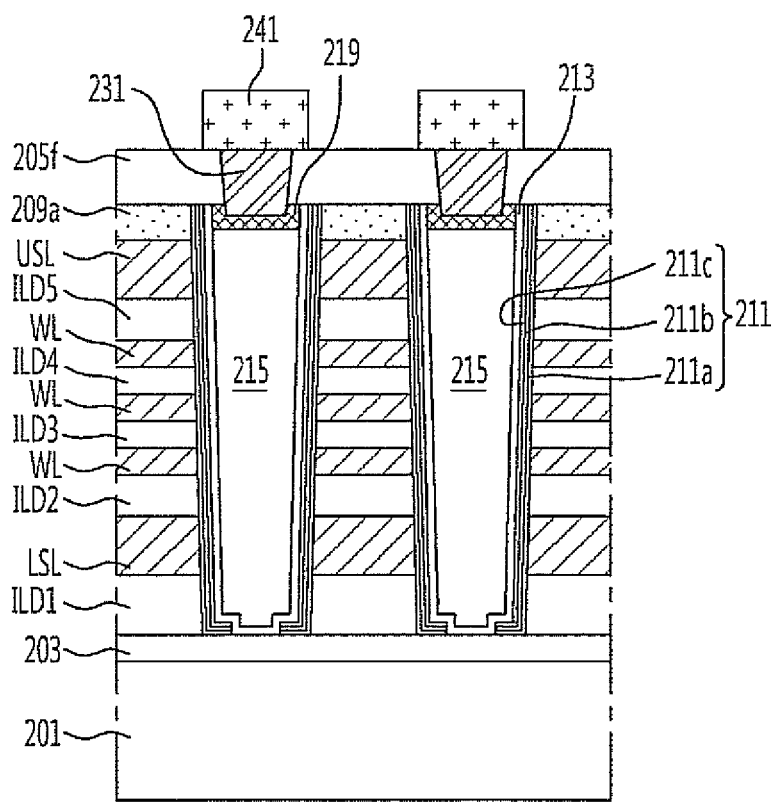

Referring to FIG. 3H, bit line contact plugs 231 are formed to be respectively connected to the impurity-doped layers 219 by filling the insides of the contact holes H3 with a conductive material. The bit line contact plugs 231 may be formed of a polysilicon layer into which N type impurities are implanted, a metal layer, or a metal silicide layer. A process subsequent to the forming of the bit line contact plugs 231 may vary according to a composition of the first material layers 205a to 205e and the second material layers 207a to 207e.

When the second material layers 207a to 207e are conductive layers and the first material layers 205a to 205e are interlayer dielectric layers, the subsequent process is described below. Slits (not shown) are formed by etching the interlayer dielectric layer 205f, the etch stop patterns 209a, the first material layers 205a to 205e, and the second material layers 207a to 207e. Then, the first and second select lines and word lines LSL, USL, and WL, and interlayer dielectric layers ILD1 to ILD5, which are divided by the slits, are formed.

When the second material layers 207a to 207e are sacrificial layers and the first material layers 205a to 205e are interlayer dielectric layers, the subsequent process is described below. First, slits (not shown) are formed as described above. Then, the interlayer dielectric layers ILD1 to ILD5, divided by the slits, are formed. Afterwards, the second material layers 207a to 207e exposed via the slits are removed. After the second material layers 207a to 207e are removed, regions from which the second material layers 207a to 207e are removed are filled with a conductive layer. The conductive layer may include at least one of a polysilicon layer, a metal layer, or a stacked structure including a barrier layer and a metal layer. Then, the first and second select lines and the word lines LSL, USL, and WL are obtained.

When the second material layers 207a to 207e are conductive layers and the first material layers 205a to 205e are sacrificial layers, the subsequent process is described below. First, slits (not shown) are formed as described above. Then, the first and second select lines and the word lines LSL, USL, and WL divided by the slits are formed. Thereafter, the first material layers 205a to 205e exposed via the slits are selectively removed using an etch process. After the first material layers 205a to 205e are selectively removed, regions from which the first material layers 205a to 205e are selectively removed are filled with the interlayer dielectric layers ILD1 to ILD5, respectively. The interlayer dielectric layers ILD1 to ILD5 may be formed of a silicon oxide layer.

A predetermined subsequent process is performed after the first and second select lines and the word lines LSL, USL, and WL, and the interlayer dielectric layers ILD1 to ILD5, which are divided by the slits, are formed. When the first and second select lines and the word lines LSL, USL, and WL exposed via the slits are polysilicon layers, the polysilicon layers exposed via the slits may be silicided to form metal silicide layers. In this case, resistance values of the first and second select lines and the word lines LSL, USL, and WL may be low.

Afterwards, the insides of the slits are filled with an insulating layer, and bit lines 241 are formed on the bit line contact plugs 231. The bit lines 241 are formed of a conductive layer, e.g., a polysilicon layer, a metal layer, or a metal silicide layer.

In the current embodiment, before the interlayer dielectric layers 205f are formed to separate the second select line USL and the bit lines 241 from one another, the process of recessing the gap-filling insulating layer 215 is performed. Thus, even if the thickness of each of the interlayer dielectric layer 205f is increased to prevent interference between the second select line USL and the bit lines 241, the recessing process is not influenced. Furthermore, in the current embodiment, the degree of recessing the gap-filling insulating layer 215 in the recessing process is lower than in the recessing process performed to form the recessed regions 117 in the previous embodiment. In the current embodiment, it is possible to minimize variation in the depths of the recessed regions 217, which may vary according to the degree of recessing the gap-filling insulating layer 215.

Figure 4:
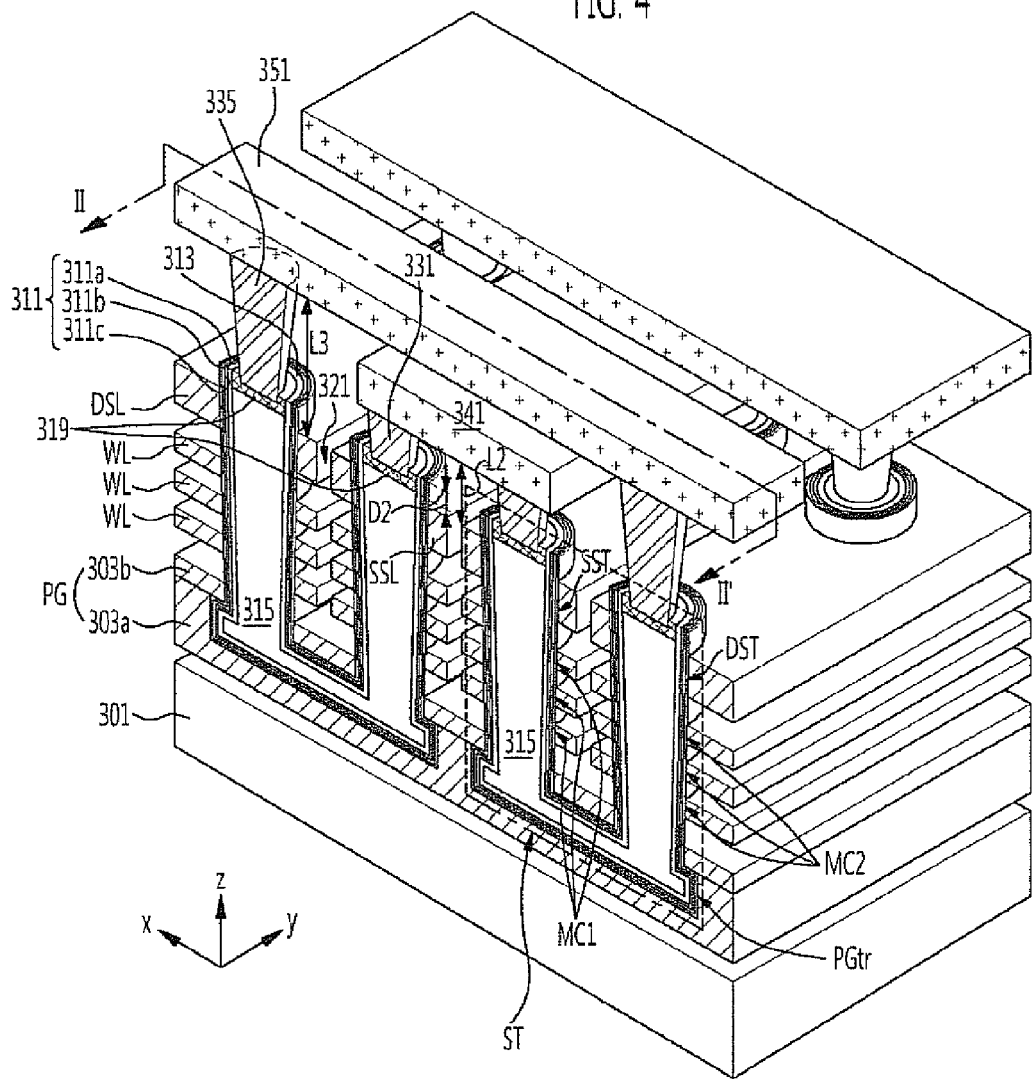
FIG. 4 is a perspective view of a semiconductor device according to another exemplary embodiment of the present invention.

FIG. 4 is a perspective view of a semiconductor device according to another exemplary embodiment of the present invention. In particular, FIG. 4 illustrates a 3D flash memory including U-shaped memory strings. In FIG. 4, interlayer dielectric layers and etch stop patterns are not illustrated.

Referring to FIG. 4, the semiconductor device includes bit lines 351, a common source line 341, and U-shaped memory strings ST connected between the common source line 341 and the bit lines 351. The memory strings ST are connected in parallel to the bit lines 351. The memory strings ST, arranged in a direction in which the common source line 341 extends, are commonly connected to the common source line 341.

The bit lines 351 are conductive patterns disposed on, but separate from, the semiconductor substrate 301. The bit lines 351 are disposed in parallel, separated from one another. For example, the bit lines 351 extend in the x-direction of the xyz coordinate system.

The common source line 341 is a conductive pattern disposed between, but separate from, the bit lines 351 and the semiconductor substrate 301. The common source line 341 extends in the y-direction that intersects the bit lines 351.

Each of the memory strings ST includes a drain select transistor DST, a first group of memory cells MC1, a pipe transistor PGtr, a second group of memory cells MC2, and a source select transistor SST, all of which are connected in series along a U-shaped channel layer 313. The drain select transistor DST is disposed under the bit line 351 to be connected to the bit line 351. The source select transistor SST is disposed under the common source line 341 to be connected to the common source line 341.

The pipe transistor PGtr is disposed on, but separate from, the semiconductor substrate 301, under the source and drain select transistors SST and DST. The first group of memory cells MC1 are connected between the drain select transistor DST and the pipe transistor PGtr. The first group of memory cells MC1 are disposed in the z-direction to be connected in series to one another. The second group of memory cells MC2 are connected between the source select transistor SST and the pipe transistor PGtr. The second group of memory cells MC2 are disposed in the z-direction to be connected in series to one another. The first and second groups of memory cells MC1 and MC2 are connected via the pipe transistor PGtr.

A pipe gate PG of the pipe transistor PGtr includes a first pipe gate layer 303a disposed on the semiconductor substrate 301 to be apart from the semiconductor substrate 301. The pipe gate PG may further include a second pipe gate layer 303b disposed on the first pipe gate layer 303a to contact the first pipe gate layer 303a. When the second pipe gate layer 303b is further included, an electric field forming area may expand to improve cell current flowing through a channel layer 313.

Gates of the first and second group of memory cells MC1 and MC2 are disposed separate from the pipe gate PG and are connected to word lines WL on the pipe gate PG. The word lines WL are stacked in a multilayer structure separate from one another. The number of the word lines WL that are to be stacked may vary according to the number of memory cells included in the memory strings ST.

Gates of the source select transistor SST and the drain select transistor DST are disposed separate from the word lines WL and are connected to a source select line SSL and a drain select line DSL on the word lines WL. Slits 321, which extend in the y-direction intersecting the bit lines 351, pass through the word lines WL, the source select line SSL, and the drain select line DSL.

Each of the memory strings ST includes one channel layer 313. The channel layer 313 is formed on a surface of an U-shaped channel hole that includes a pair of channel holes passing through the source select line SSL, the drain select line DSL, the word lines WL, and a trench formed in the first pipe gate layer 303a that connects the pair of channel holes.

An outer surface of the channel layer 313 is covered with a multilayer film 311. The multilayer film 311 has a stacked structure including a first insulating layer 311a, a charge storage layer 311b, and a second insulating layer 311c. The channel layer 313 is used as a channel of the source and drain select transistors SST and DST, the first and second groups of memory cells MC1 and MC2, and the pipe transistor PGtr.

The channel layer 313 may have a hollow U-shape, and the inside of the hollow U-shaped channel layer 313 is filled with a gap-filling insulating layer 315 and impurity-doped layers 319 that will become junction regions.

The impurity-doped layers 319 are formed on the gap-filling insulating layer 315, contact the channel layer 313, and may be used as drain/source junction regions of the memory strings ST. To connect the common source line 341 and the memory strings ST, source line contact plugs 331 are further formed between the common source line 341 and the impurity-doped layer 319. To connect the bit lines 351 and the memory strings ST, bit line contact plugs 335 are further formed between the bit lines 351 and the impurity-doped layer 319. A distance L2 between the impurity-doped layer 319 and the common source line 341 is set to be greater than a depth D2 of the impurity-doped layer 319. Bottom surfaces of the impurity-doped layers 319 may be formed to be higher than bottom surfaces of the source and drain select line SSL and DSL.

FIGS. 5A to 5I are cross-sectional views, taken along a line II-II' of FIG. 4, illustrating a method of manufacturing a semiconductor device according to an exemplary embodiment of the present invention.

Figure 5A:
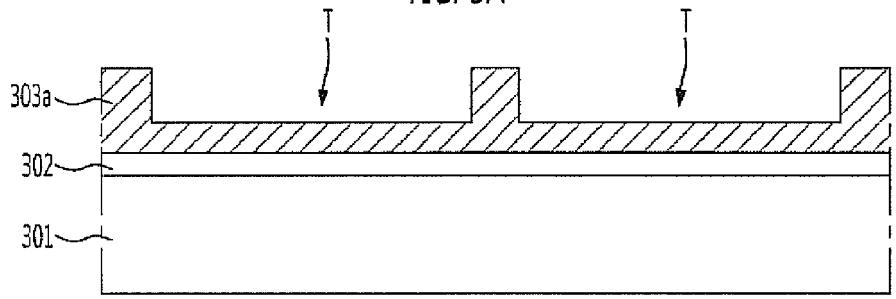
FIGS. 5A to 5I are cross-sectional views illustrating a method of manufacturing a semiconductor device according to another exemplary embodiment of the present invention, taken along a line II-IP of FIG. 4.

Referring to FIG. 5A, an interlayer dielectric layer 302 is formed on a semiconductor substrate 301. Then, a first pipe gate layer 303a is formed on the interlayer dielectric layer 302. The interlayer dielectric layer 302 may be formed of a silicon oxide layer. The first pipe gate layer 303a may be a conductive layer formed of a polysilicon layer, a metal silicide layer, or a metal layer.

After the first pipe gate layer 303a is formed, the first pipe gate layer 303a is partially etched to form trenches T. The trenches T may be arranged in a matrix including a plurality of rows and a plurality of columns.

Figure 5B:
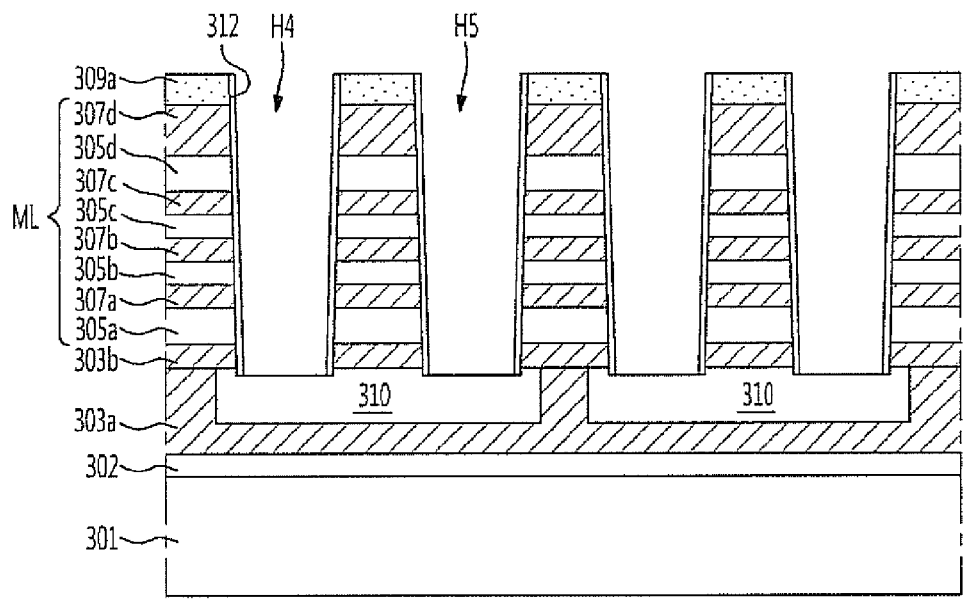

Referring to FIG. 5B, the trenches T are filled with the sacrificial layer 310. A second pipe gate layer 303b is formed on the first pipe gate layer 303a including the sacrificial layer 310. First multilayer material layers 305a to 305d and second multilayer material layers 307a to 307d are alternately stacked on the second pipe gate layer 303b. Therefore a multilayered structure ML is formed on the second pipe gate layer 303b. The forming of the second pipe gate layer 303b may be skipped. Then, a hard-mask layer is formed on the multilayered structure ML, and etch stop patterns 309a are formed by patterning a hard-mask layer. Thereafter, first and second channel holes H4 and H5 are formed to pass through the multilayered structure ML, so as to expose the sacrificial layer 310, by removing some regions of the multilayered structure ML exposed via the etch stop patterns 309a.

The sacrificial layer 310 is formed of a material having a different etch selectivity from that of the hard-mask layer. For example, the sacrificial layer 310 may be an oxide layer.

The uppermost second material layer 307d, among the second material layers 307a to 307d, defines regions in which source and drain select lines are to be formed. Other second material layers 307a to 307c, formed under the second material layer 307d, define regions in which word lines are to be formed. The number of the stacked second material layers 307a to 307c, which define the regions in which word lines are to be formed, may vary according to a desired number of memory cells to be stacked. The second material layer 307d that defines the regions in which the source and drain select lines are to be formed may be thicker than the second material layers 307a to 307c that define the regions in which word lines are to be formed. The uppermost layer of the multilayered structure ML according to the current embodiment is the second material layer 307d that defines the regions in which the source and drain select lines are to be formed.

Among the first material layers 305a to 305d of the multilayered structure ML, the first material layer 305d, which defines distances between the drain select line and the word lines or between the source select line and the word lines, may be thicker than the other first material layers 305a to 305c.

A composition of the first material layers 305a to 305d and the second material layers 307a to 307d is the same as that of the first material layers 205a to 205e and the second material layers 207a to 207e described above with reference to FIG. 3A.

The etch stop patterns 309a are formed of an insulating material that functions as a hard-mask layer. The etch stop patterns 309a are formed on the second material layer 307d, which is the uppermost layer of the multilayered structure ML, and directly contact the second material layer 307d. The etch stop patterns 309a act as etch barriers during a subsequent process of forming the first and second channel holes H4 and H5 by etching the multilayered structure ML to expose the sacrificial layer 310. The etch stop patterns 309a may be formed of a material having an etch selectivity different from an etch selectivity of the sacrificial layer 310, the first material layers 305a to 305d, and the second material layers 307a to 307d. For example, the etch stop patterns 309a may be formed of a silicon nitride layer. The etch stop patterns 309a are formed to be thick enough not to be removed during an etch process for forming the first and second channel holes H4 and H5. The thickness of each of the etch stop patterns 309a varies according to a height of the multilayered structure ML.

The first and second channel holes H4 and H5 may be formed by removing, using anisotropic etching, the first material layers 305a to 305d and the second material layers 307a to 307d of the multilayered structure ML, which have been exposed via the etch stop patterns 309a. Each of the pair of first and second channel holes H4 and H5 is disposed at a corresponding end of each of the trenches T, thereby exposing the sacrificial layer 310.

Thereafter, spacers 312, which have an etch selectivity that is different from the etch selectivity of the sacrificial layer 310, are formed on sidewalls of the first and second channel holes H4 and H5, so as to prevent the first material layers 305a to 305d from being damaged during a subsequent etch process of removing the sacrificial layer 310. The spacers 312 may be formed of the same material as etch stop patterns 309c, and may be formed thinner than the etch stop patterns 309a.

Figure 5C:
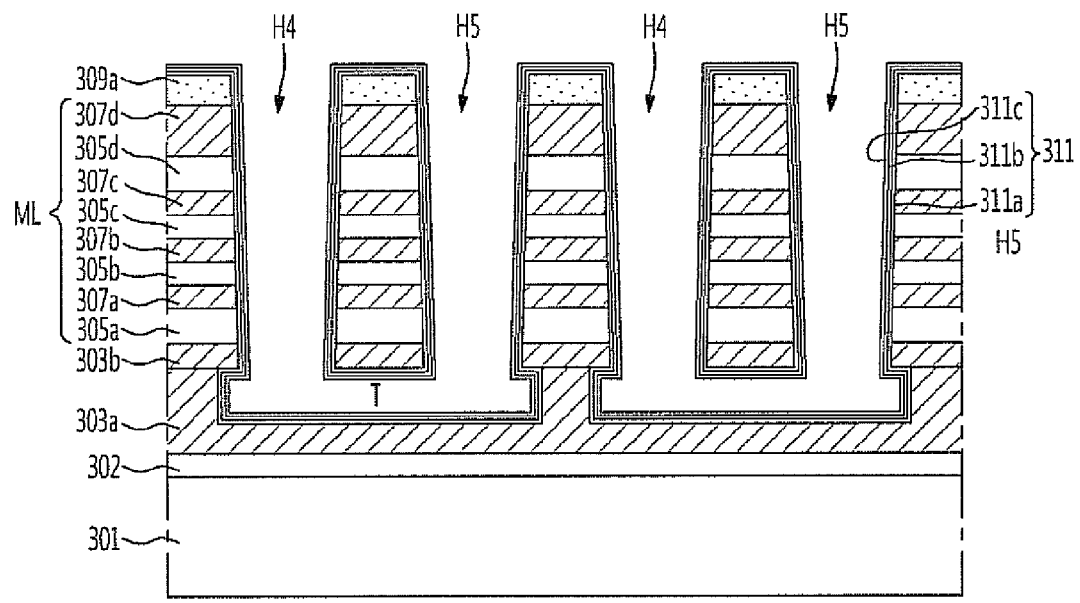

Referring to FIG. 5C, the sacrificial layer 310, exposed via the first and second channel holes H4 and H5, is removed to open the trenches T, and the spacers 312 are then removed. Then, U-shaped channel holes including the first and second channel holes H4 and H5 and the trenches T connecting the first and second channel holes H4 and H5 are open. Since the spacers 312 are thinner than the etch stop patterns 309a, the etch stop patterns 309a may remain when the spacers 312 are removed.

Thereafter, a multilayer film 311 is formed on a surface of the entire resultant structure including the U-shaped channel holes. The multilayer film 311 may be obtained by stacking a first insulating layer 311a, a charge storage layer 311b, and a second insulating layer 311c. The charge storage layer 311b may be formed of a nitride layer that allows charge trapping, and the first and second insulating layers 311a and 311c may be formed of an oxide layer.

Figure 5D:
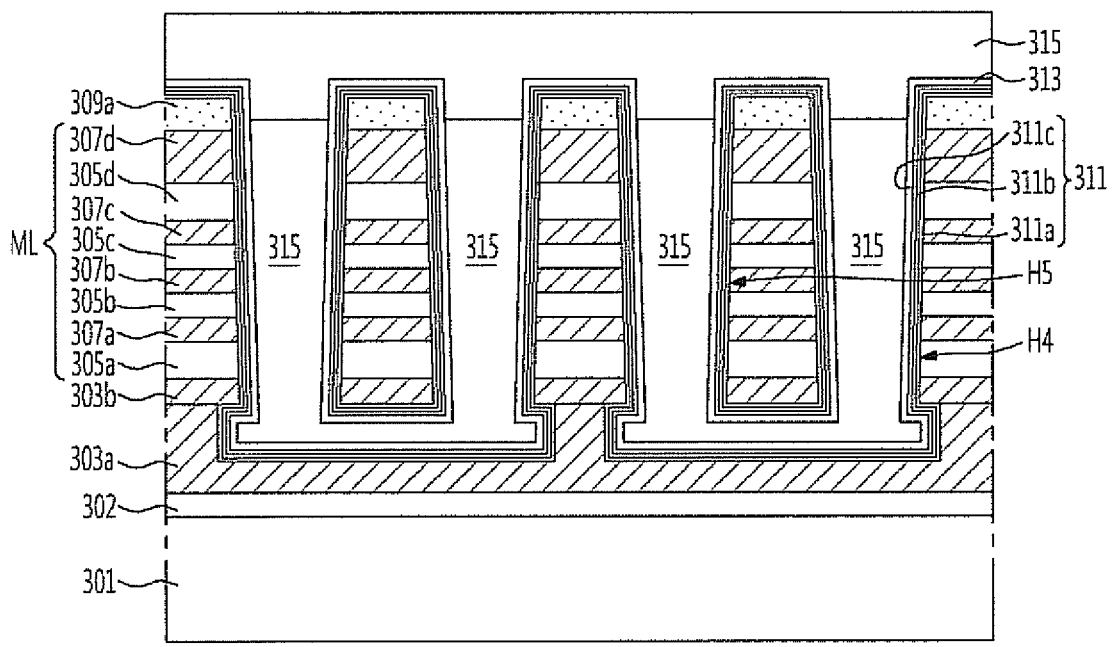

Referring to FIG. 5D, a channel layer 313 is formed on a surface of the entire resultant structure including the multilayer film 311. The channel layer 313 may be a semiconductor layer and may be formed of a silicon layer.

Then, a gap-filling insulating layer 315 is formed on a surface of the entire resultant structure, including the channel layer 313, to a thickness sufficient to fill the insides of the U-shaped channel holes and spaces between the etch stop patterns 309a with the gap-filling insulating layer 315. The gap-filling insulating layer 315 may be formed of an insulating material having a high fluidity, so that the insides of the U-shaped channel holes that are narrow and long may be filled with the gap-filling insulating layer 315 without any voids. For example, the gap-filling insulating layer 315 may be formed of an SOD layer. The SOD layer may be formed of polysilazane (PSZ).

Figure 5E:
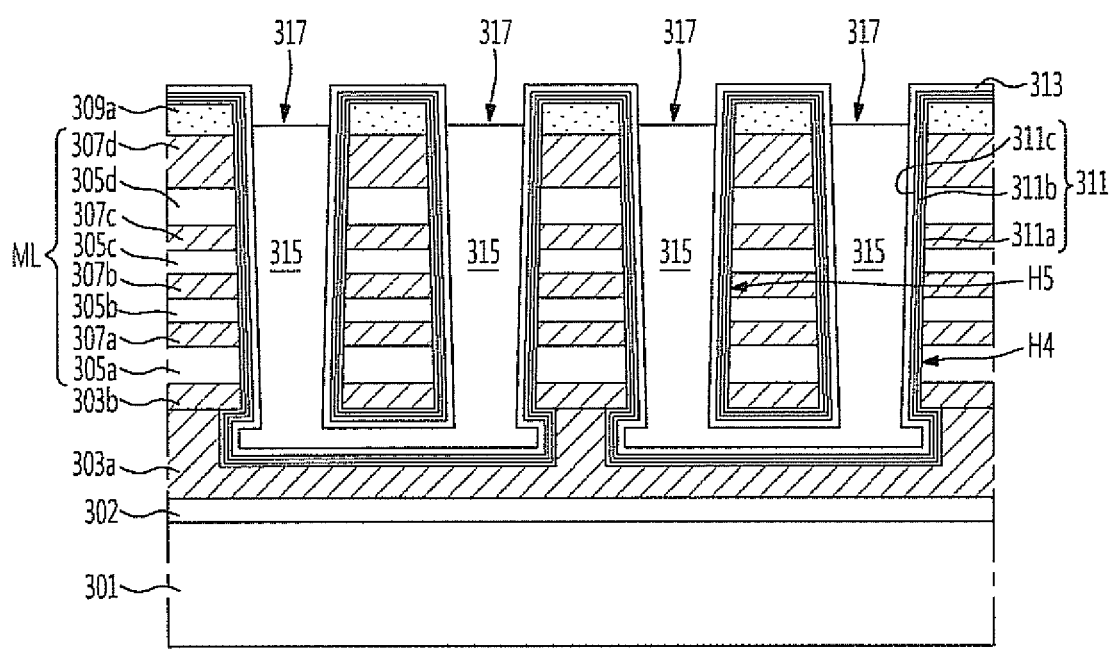

Referring to FIG. 5E, the gap-filling insulating layer 315 is planarized in the planarization process until the channel layer 313 is exposed, and is then recessed in the wet etch process. Then, an upper surface of the gap-filling insulating layer 315 is lower than those of the etch stop patterns 309a, and recessed regions 317 are formed between the etch stop patterns 309a from which the gap-filling insulating layer 315 is removed. The planarization process may be performed by CMP.

The recessed regions 317 are to be filled with an impurity-doped layer in a subsequent process. In a previous embodiment described above with reference to FIG. 1C, the recessed regions 117 are formed by etching not only the gap-filling insulating layer 115 filled between the hard mask patterns 107a, which are etch stop patterns, but also a part of the gap-filling insulating layer 115 formed in a region passing through the interlayer dielectric layer 105. In the previous embodiment, this controls the distance between an impurity-doped layer and a conductive layer, for a select gate, to appropriately drive the semiconductor device. In contrast, in the current embodiment, the recessed regions 317 are formed by partially etching the gap-filling insulating layer 315 between the etch stop patterns 309a. Thus, the degree of etching of the gap-filling insulating layer 315 that is required to form the recessed regions 317 may be less than in the previous embodiment described above with reference to FIGS. 1A to 1F. Thus, in the current embodiment, recessing the gap-filling insulating layers 315 in U-shaped channel holes may be more uniformly controlled to than in the previous embodiment described above with reference to FIGS. 1A to 1F. Thus, depths of the recessed regions 317 may be more uniform than would be achieved in the previous embodiment, described above with reference to FIGS. 1A to 1F. When the depths of the recessed regions 317 are more uniform, the thicknesses of impurity-doped layers that are to be respectively formed in the recessed regions 317 during a subsequent process may be more uniform. Thus, operating characteristics of the memory strings ST may be made more uniform. As a result of the recessed regions 317, the upper surfaces of the gap-filling insulating layers 315 are lower than upper surfaces of the etch stop patterns 309a. The upper surfaces of the gap-filling insulating layers 315, which define bottoms of the recessed regions 317, may be controlled not to be lower than a bottom surface of the second material layer 307d, which defines the regions in which the source and drain select lines are to be formed.

Figure 5F:
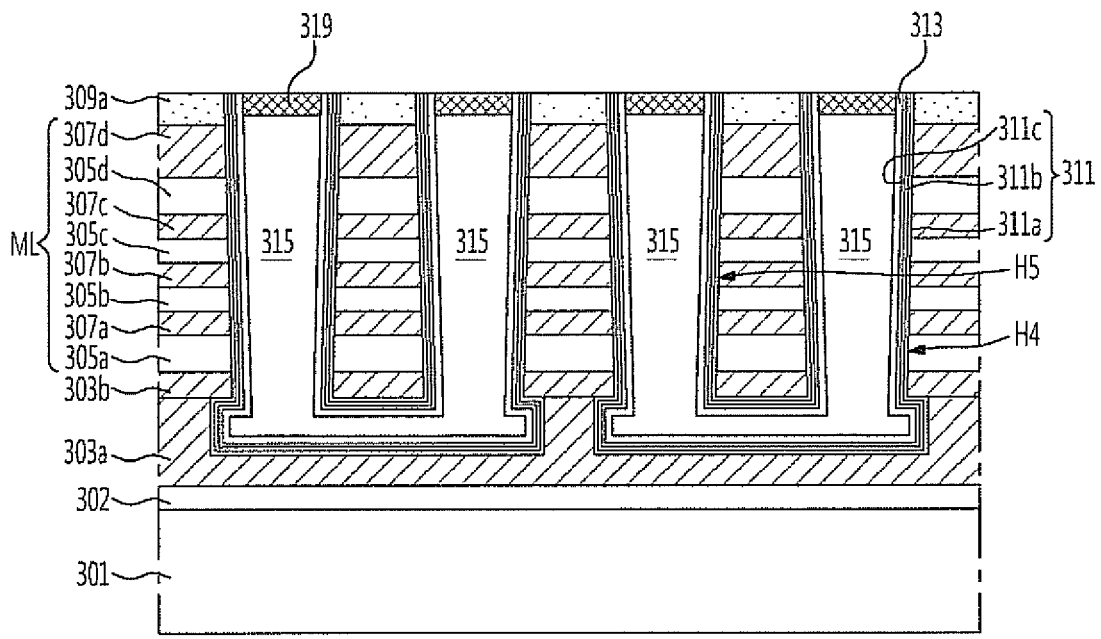

Referring to FIG. 5F, the recessed regions 317 are filled with an impurity-doped layer 319. For example, the impurity-doped layer 319 may be a polysilicon layer into which N type impurities are implanted. The impurity-doped layer 319 is connected to the channel layer 313.

Afterwards, as described above with reference to FIG. 3F, the impurity-doped layer 319, the channel layer 313, and the multilayer film 311 are planarized in the planarization process until the etch stop patterns 309a, which are nitride layers, are exposed.

Figure 5G:
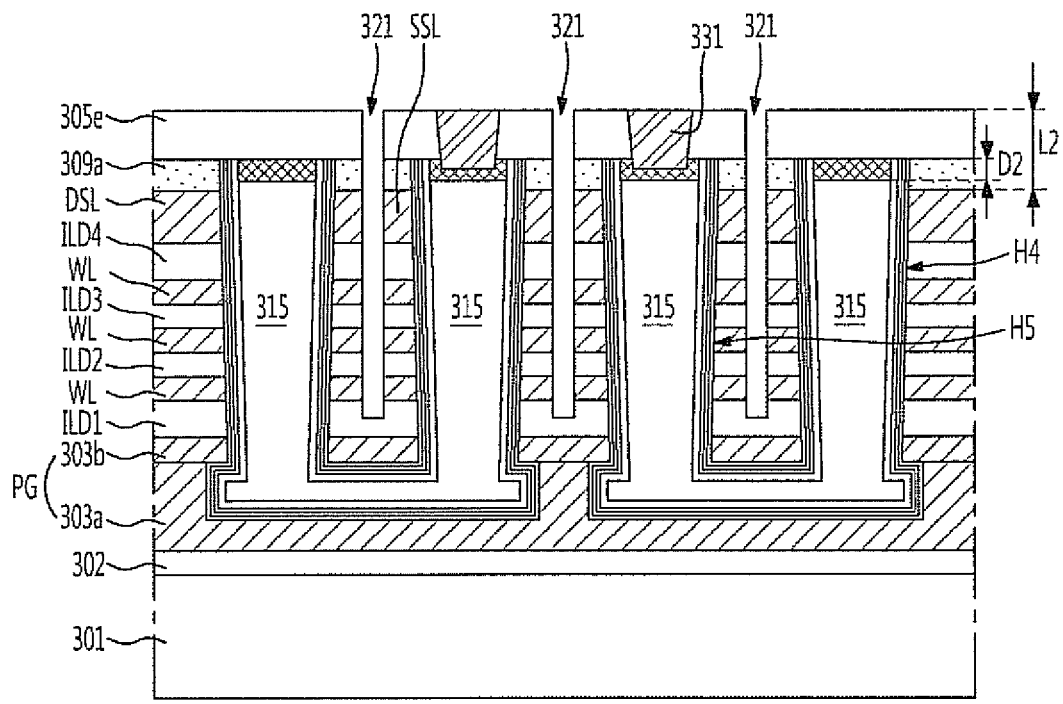

Referring to FIG. 5G, an interlayer dielectric layer 305e, which is to be formed on the source and drain select gate lines, is formed on the entire resultant structure including the etch stop patterns 309a and the planarized impurity-doped layer 319. The interlayer dielectric layer 305e may be formed of a silicon oxide layer.

A thickness of the interlayer dielectric layer 305e defines a distance L2 between a common source line and a source select line that are to be formed in a subsequent process. Thus, the thickness of the interlayer dielectric layer 307d should be thick enough to prevent interference between the source select transistor and the common source line. In the current embodiment, the recessed regions 317 are formed by etching the gap-filling insulating layer 315, filling the recessed regions 317 with the impurity-doped layer 319, and then forming the interlayer dielectric layer 307e on the source and drain select gate lines. Thus, even if the thickness of the interlayer dielectric layer 305e changes, the degree of recessing the gap-filling insulating layer 215 needed to form the recessed regions 317 does not change. Accordingly, the interlayer dielectric layer 307e may be formed to be thick enough to prevent interference between the source select line and a source line, without considering the degree of recessing of the gap-filling insulating layer 315.

The interlayer dielectric layer 305e is formed to be thicker than the first material layers 305a, 305b, and 305c that define the distances between word lines, and thicker than a thickness D2 of the impurity-doped layer 319 to prevent such interference.

After the interlayer dielectric layer 305e is formed, a process of forming first contact holes in the interlayer dielectric layer 305e is performed. The first contact holes are formed to overlap with upper portions of the second channel holes H5.

This process includes forming a mask pattern (not shown) for opening regions in which the first contact holes are to be formed, partially exposing the impurity-doped layer 319 by removing some regions of the interlayer dielectric layer 305e that are open via the mask pattern, and removing the mask pattern. The mask pattern is formed of a material having an etch selectivity that is different from an etch selectivity of the interlayer dielectric layer 305e and the etch selectivity of the impurity-doped layer 319. For example, the mask pattern may be formed of a silicon nitride layer used to form the etch stop pattern 309a.

In the current embodiment, when a material different from the interlayer dielectric layer 305e, such as the etch stop pattern 309a, remains, the first contact holes are formed. Thus, even if miss alignment occurs during the forming of the first contact holes, an etch process for forming the first contact holes may be stopped by the etch stop patterns 309a. Thus, it is possible to prevent the etch stop patterns 309a from being removed between a plurality of the impurity-doped layers 319, thereby ensuring adequate insulation between the impurity-doped layers 319.

Thereafter, source line contact plugs 331 are formed to contact to the impurity-doped layer 319 and to align with the second channel holes H5 by filling the insides of the first contact holes with a conductive material. The source line contact plugs 331 may be formed of a doped polysilicon layer into which N type impurities are implanted, a metal layer, or a metal silicide layer.

After the source line contact plugs 331 are formed, slits 321 are formed to pass through the multilayered structure ML by etching the multilayered structure ML. The slits 321 are formed between the first and second channel holes H4 and H5.

Figure 5H:
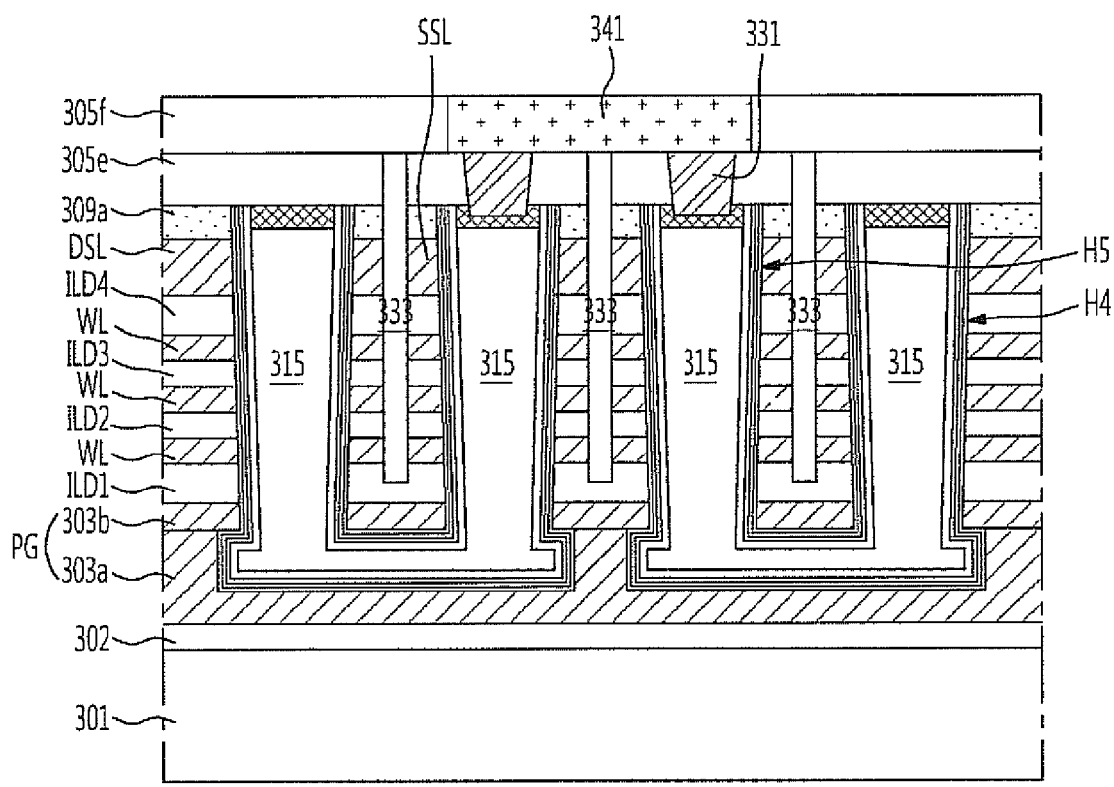

Referring to FIG. 5H, a subsequent process is performed to form a source select line SSL and a drain select line DSL divided by the slits 321, word lines WL divided by the slits 321, and interlayer dielectric layers ILD1 to ILD4 divided by the slits 321. This process may vary according to a composition of the first material layers 305a to 305d and the second material layers 307a to 307d. This process is as described above with reference to FIG. 3H.

Afterwards, the insides of the slits 321 are filled with an insulating layer 333. Then, an interlayer dielectric layer 305f is formed on the entire resultant structure including the insulating layer 333. The insulating layer 333 and the interlayer dielectric layer 305f may be formed of the same material. Otherwise, the slits 321 may be filled with the interlayer dielectric layer 305f without forming the insulating layer 333.

Then, source line trenches are formed by etching the interlayer dielectric layer 305f to expose the source line contact plugs 331, and the insides of the source line trenches are filled with a conductive layer, thereby forming a common source line 341.

Figure 5I:
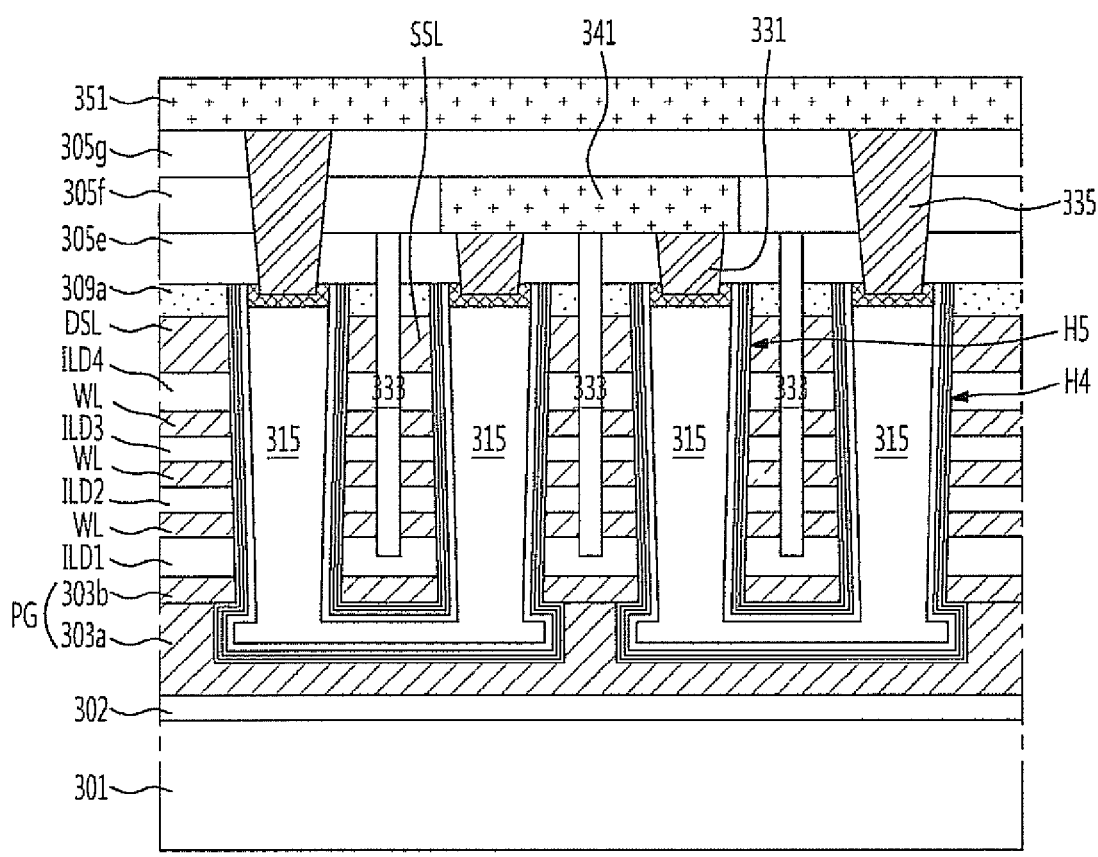

Referring to FIG. 5I, an interlayer dielectric layer 305g is formed on the entire resultant structure including the common source line 341. Then, second contact holes are formed to expose the impurity-doped layer 319 by etching the interlayer dielectric layers 305d, 305f, and 305g above the first channel holes H4. A process of forming the second contact holes is the same as the process of forming the first contact holes, except for thicknesses and locations of layers to be etched.

Thereafter, bit line contact plugs 335 are formed to be connected to the impurity-doped layer 319 and contact the first channel holes H4 by filling the insides of the second contact holes with a conductive material. The bit line contact plugs 335 may be formed of a doped polysilicon layer into which N type impurities are implanted, a metal layer, or a metal silicide layer.

After the bit line contact plugs 335 are formed, bit lines 351 are formed on the bit line contact plugs 335. The bit lines 351 are formed of a conductive layer, e.g., a polysilicon layer, a metal layer, or a metal silicide layer.

In the current embodiment, before the interlayer dielectric layer 305f is formed to separate the source select line SSL and the common source line 341 from each other, the process of recessing the gap-filling insulating layer 315 is performed. Thus, the recessing process is not influenced even if a thickness of the interlayer dielectric layer 305e is increased to prevent interference between the source select fine SSL and the common source line 341. Also, in the current embodiment, a degree of recessing the gap-filling insulating layer 315 is less than in the previous embodiment of FIGS. 1A to 1F. Accordingly, in the current embodiment, it is possible to minimize a variation in depths of recessed regions caused by the degree of recessing the gap-filling insulating layer 315.

Figure 6:
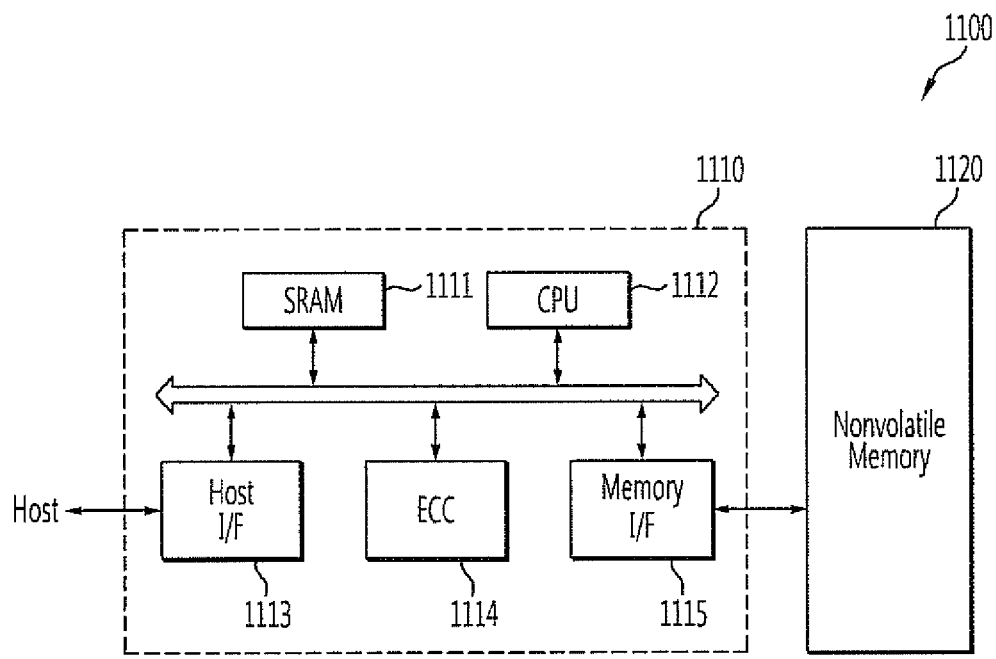
FIG. 6 is a block diagram of a memory system according to an exemplary embodiment of the present invention.

FIG. 6 is a block diagram of a memory system 1100 according to an exemplary embodiment of the present invention.

Referring to FIG. 6, the memory system 1100 includes a nonvolatile memory device 1120 and a memory controller 1110.

The nonvolatile memory device 1120 includes a nonvolatile memory device, as described above with references to FIGS. 2 and 4. Otherwise, the nonvolatile memory device 1120 may be a multi-chip package including a plurality of flash memory chips.

The memory controller 1110 is configured to control the nonvolatile memory device 1120, and may include a static random access memory (SRAM) 1111, a central processing unit (CPU) 1112, a host interface 1113, an error correcting code (ECC) unit 1114, or a memory interface 1115. The SRAM 1111 is used to operate the CPU 1112. The CPU 1112 performs overall control operations for data exchanges of the memory controller 1110. The host interface 1113 includes a data exchange protocol of a host (not shown) connected to the memory system 1100. Also, the ECC 1114 detects and corrects an error contained in data read from the nonvolatile memory device 1120. The memory interface 1115 performs interfacing with the nonvolatile memory device 1120. The memory controller 1110 may further include an RCM for storing code data for interfacing with the host.

The memory system 1100, configured as described above, may be a memory card or a solid state drive (SSD) that is a combination of the nonvolatile memory device 1120 an the memory controller 1110. For example, when the memory system 1100 is an SSD, the memory controller 1110 may communicate with an external device, e.g., the host, via one of various interface protocols, e.g., a universal serial bus (USB), a multimedia card (MMC), a peripheral component interconnect express (PCI-E), a serial advanced technology attachment (SATA), a parallel advanced technology attachment (PATA), a small computer system interface (SCSI), an enhanced small device interface (ESDI), and an integrated drive electronics (IDE).

Figure 7:
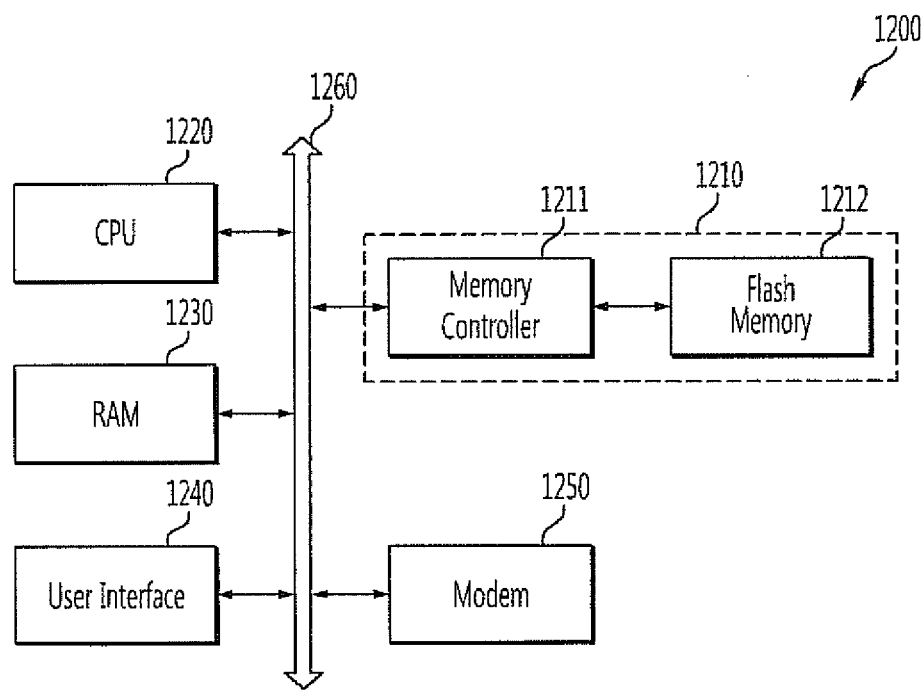
FIG. 7 is a block diagram of a computing system according to an exemplary embodiment of the present invention.

FIG. 7 is a block diagram of a computing system 1200 according to an exemplary embodiment of the present invention.

Referring to FIG. 7, the computing system 1200 may include a CPU 1220, a RAM 1230, a user interface 1240, a modem 1250, or a memory system 1210 that are electrically connected to a system bus 1260. If the computing system 1200 is a mobile device, the computing system 1200 may further include a battery for applying an operating voltage to the computing system 1200. The computing system 1200 may further include an application chip set, a camera image processor (CIS), a mobile RAM, and so on.

As described above with reference to FIG. 6, the memory system 1210 may include a nonvolatile memory 1212 and a memory controller 1211.

According to one or more embodiments of the present invention, a degree of recessing a gap-filling insulating layer covered with a channel layer is reduced to enhance the uniformity of depths of recessed regions formed by recessing the gap-filling insulating layer. Accordingly, impurity-doped layers formed in the recessed regions may have more uniform depths, thereby improving the reliability of a semiconductor device.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
    forming a multilayered structure by alternately stacking first material layers and second material layers on a substrate, wherein the second material layers are formed in a word line region and in a select line region, the select line region being located above the word line region;
    forming etch stop patterns on the multilayered structure, wherein the etch stop patterns come into contact with an uppermost layer of the second material layers;
    forming channel holes by etching the multilayered structure using the etch stop patterns as an etch barrier;
    forming channel layers on surfaces of the channel holes;
    filling the channel holes and a space between the etch stop patterns with insulating layers;
    forming recessed regions between the etch stop patterns by recessing the insulating layers;
    forming impurity-doped layers inside the recessed regions; and
    forming an interlayer dielectric layer over the impurity-doped layers and the etch stop patterns.

2. The method of claim 1, wherein bottom surfaces of the recessed regions are formed higher than a bottom surface of the uppermost layer, which is one of the second material layers.

3. The method of claim 1, wherein the first material layers are insulating layers, and
    the second material layers are conductive layers.

4. The method of claim 1, wherein the first material layers are insulating layers, and
    the second material layers are sacrificial layers.

5. The method of claim 4, further comprising:
    forming a slit through the multilayered structure after the interlayer dielectric layer is formed;
    removing the second material layers exposed via the slit; and
    filling regions from which the second material layers are removed with a conductive layer.

6. The method of claim 1, wherein the second material layers, formed in the select line region, are thicker than the second material layers in the word line region.

7. The method of claim 1, wherein the interlayer dielectric layer is thicker than either one of the first material layers, formed between the second material layers in the word line region, or each of the impurity-doped layers.

8. The method of claim 1, further comprising:
    forming a pipe gate layer on the substrate;
    forming trenches in the pipe gate layer; and
    filling the trenches with a sacrificial layer, and
    where the multilayer structure is formed on the pipe gate layer and the sacrificial layer.

9. The method of claim 8, wherein forming the channel holes exposes the sacrificial layer.

10. The method of claim 9, wherein forming the channel layer further comprises:
    removing, from the trenches, the sacrificial layer exposed via the channel holes; and
    forming the channel layer in the trenches.

11. The method of claim 1, wherein the etch stop patterns are nitride layers.

* * * * *